United States Patent
Wang et al.

(10) Patent No.: US 9,343,658 B2
(45) Date of Patent: May 17, 2016

(54) MAGNETIC MEMORY BITS WITH PERPENDICULAR MAGNETIZATION SWITCHED BY CURRENT-INDUCED SPIN-ORBIT TORQUES

(71) Applicant: THE REGENTS OF THE UNIVERSITY OF CALIFORNIA, Oakland, CA (US)

(72) Inventors: Kang L. Wang, Santa Monica, CA (US); Pedram Khalili Amiri, Los Angeles, CA (US); Guoqiang Yu, Los Angeles, CA (US); Pramey Upadhyaya, Los Angeles, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 14/528,732

(22) Filed: Oct. 30, 2014

(65) Prior Publication Data
US 2015/0129995 A1    May 14, 2015

Related U.S. Application Data

(60) Provisional application No. 61/897,218, filed on Oct. 30, 2013.

(51) Int. Cl.
*H01L 43/02* (2006.01)
*H01L 43/08* (2006.01)
*H01L 43/06* (2006.01)
*G11C 11/16* (2006.01)
*G11C 11/18* (2006.01)

(52) U.S. Cl.
CPC .............. *H01L 43/08* (2013.01); *G11C 11/161* (2013.01); *G11C 11/18* (2013.01); *H01L 43/06* (2013.01)

(58) Field of Classification Search
CPC .......... H01L 43/02; H01L 43/12; H01L 43/10
See application file for complete search history.

(56) References Cited

U.S. PATENT DOCUMENTS

| 7,630,232 | B2 * | 12/2009 | Guo | ................ | B82Y 25/00 365/158 |
| 2014/0104941 | A1 * | 4/2014 | Kondo | ................ | G11C 11/02 365/171 |

OTHER PUBLICATIONS (Perpendicular switching of a single ferromagnetic layer induced by in-plane current injection Aug. 11, 2011 |vol. 476 |Nature |189) by Miron et al.*

* cited by examiner

*Primary Examiner* — Howard Weiss
*Assistant Examiner* — Sue Tang
(74) *Attorney, Agent, or Firm* — O'Banion & Ritchey LLP; John P. O'Banion (57) ABSTRACT

A basic Spin-Orbit-Torque (SOT) structure with lateral structural asymmetry is provided that produces a new spin-orbit torque, resulting in zero-field current-induced switching of perpendicular magnetization. More complex structures can also be produced incorporating the basic structure of a ferromagnetic layer with a heavy non-magnetic metal layer having strong spin-orbit coupling on one side, and an insulator layer on the other side with a structural mirror asymmetry along the in-plane direction. The lateral structural asymmetry and new spin-orbit torque, in effect, replaces the role of the external in-plane magnetic field. The direction of switching is determined by the combination of the direction of applied current and the direction of symmetry breaking in the device.

30 Claims, 5 Drawing Sheets

MAGNETIC MEMORY BITS WITH PERPENDICULAR MAGNETIZATION SWITCHED BY CURRENT-INDUCED SPIN-ORBIT TORQUES

CROSS-REFERENCE TO RELATED APPLICATIONS

This application claims priority to, and the benefit of, U.S. provisional patent application Ser. No. 61/897,218 filed on Oct. 30, 2013, incorporated herein by reference in its entirety.

STATEMENT REGARDING FEDERALLY SPONSORED RESEARCH OR DEVELOPMENT

This invention was made with Government support under HR0011-10-C-0153 awarded by the Defense Advanced Research Projects Agency. The Government has certain rights in the invention.

INCORPORATION-BY-REFERENCE OF COMPUTER PROGRAM APPENDIX

Not Applicable

BACKGROUND

1. Technical Field

This technology pertains generally to spin-based nano-electronic devices and systems that use the orbital properties of electrons rather than their charge, and more particularly to laminates producing spin-orbit torques that can switch the magnetization in perpendicularly magnetized laminates without the need for an external magnetic field.

2. Background Discussion

In the emerging technology of spintronics, short for "spin electronics," not only are electron charges utilized, but the intrinsic spin of the electrons and the associated magnetic moments are utilized as well. The aims of spintronic applications are to control, manipulate and measure the magnetization of nanostructures using the spin of an electric current.

In principle, manipulating spin or magnetization should require far less energy than is required to move charge, should be faster and can take place at very small scales. Thus, the utilization of the electron's spins has advantages over the conventional electronic devices such as low power consumption, and non-volatility.

Spin transfer torque (STT) and spin-orbit torque (SOT) driven magnetization dynamics provide two different approaches to the creation and manipulation of nanoscale magnetic devices. Spintronic devices generally employ a magnetic material in multilayers to utilize the spin of the charges. Current flowing through one layer is spin polarized and the polarized current interacts with the magnetization of adjacent layers.

In the case of the spin transfer torque effect, angular momentum from electrons in a spin polarized current is transferred to the localized d-electrons that hold the magnetization in a ferromagnetic film. The electrons exert a net effective torque on the magnetic moment of the ferromagnetic material, generally called spin transfer torque (STT), as a result of the conservation of angular momentum. However, the level of current density needed to reorient the magnetization using STT is presently too high for most commercial applications or contributes to a reduction in the useful life of the devices. Conventional STT-MRAM devices, for example, experience rapid aging of the tunnel barriers produced by high writing current densities.

In contrast to the transference of spin angular momentum between two non-collinear magnetic layers or domains with STT, the spin-orbit torque (SOT) effect involves the transfer of orbital momentum from the lattice to the spin system.

Current-induced magnetic manipulation and switching is possible with the injection of an in-plane current into the non-magnetic layer that produces a perpendicular (out of plane) spin current which is transferred to the magnetization in an adjacent ferromagnetic layer creating a spin torque. Spin current generation may arise from the metal layer by the spin Hall effect or it may arise at the interface by current induced spin polarization (the Rashba-Edelstein effect).

Spin orbit torques (SOTs) are also of interest because they can lead to magnetization switching in geometries that are not possible with conventional spin transfer torque (STT) devices.

Magnetization switching by current-induced spin-orbit torques is of great interest due to its potential applications in ultralow-power memory and logic devices. These devices need the SOT effects to switch ferromagnets with a perpendicular (out-of-plane) magnetization. At the present time, however, the presence of an in-plane external magnetic field is typically required to assist SOT-driven switching and this is a major obstacle for any practical application. In conventional devices, the external field allows each current direction to favor a particular orientation for the out-of-plane component of magnetization, thereby resulting in deterministic perpendicular switching. However, this external field is undesirable from a practical point of view because it also reduces the thermal stability of the perpendicular magnet by lowering the zero-current energy barrier between the stable perpendicular states, resulting in a shorter retention time if used for memory, for example. A critical requirement to achieve high-density SOT memory, therefore, is the ability to perform SOT-induced switching without the use of external magnetic fields, in particular for perpendicularly-magnetized ferromagnets, which show better scalability and thermal stability as compared to the in-plane case. However, there are currently no practical solutions that meet this requirement.

Accordingly, there is a need for devices that produce SOTs that can switch the magnetization in perpendicularly magnetized films without the need for an external magnetic field. The technology described herein satisfies this need as well as others and is generally an improvement in the art.

BRIEF SUMMARY

The technology described herein provides a basic apparatus structure that performs SOT-induced switching of out of plane magnetization without the use of external magnetic fields that can be adapted and incorporated into a variety of applications. A new NM/F/I structure is provided that produces a novel spin-orbit torque, resulting in zero-field current-induced switching of perpendicular magnetization. More complex structures can be produced that incorporate the basic laminate structure.

Exemplary heterostructures exhibiting SOTs according to the technology described herein comprise a ferromagnet (F) layer with a heavy nonmagnetic conductive layer (NM) having strong spin-orbit coupling on one side, and an insulator (I) layer on the other side and are referred to as NM/F/I structures, which break mirror symmetry in the growth direction. In conventional NM/F/I heterostructures, the form of the resultant current-induced SOT alone does not allow for deterministic switching of a perpendicular ferromagnet, requiring the application of an additional external in-plane magnetic field to switch the perpendicular magnetization.

The SOT-induced switching of out-of-plane magnetized NM/F/I heterostructures, without the need for any external magnetic fields is achieved by introducing a lateral structural asymmetry into the laminate structure during fabrication. The basic laminate is a stack of NM/F/I layers that has a structural mirror asymmetry along the in-plane direction. The lateral structural asymmetry, in effect, replaces the role of the external in-plane magnetic field. The lateral structural asymmetry can be provided by any of the layers.

Symmetry-based analysis of SOT interactions in the base asymmetric structure indicates that the observed bias-field-free switching originates from the lateral symmetry-breaking of the laminate, which gives rise to a new field-like torque ($H_z^{FL}$) upon the application of an in-plane current. The direction of the current-induced effective field corresponding to this field-like SOT is out-of-plane facilitating the switching of perpendicular magnets.

The structural asymmetry can be engineered in various magnetic heterostructures to produce the novel fundamental interactions between electric currents and magnetization, resulting in spin-orbit-torques (SOTs) on the magnetization that can be used in many device applications. For example, the use of SOTS in NM/F/I structures allows for a significantly lower write current compared to regular (STT) devices. The base apparatus can greatly improve energy efficiency and scalability for new SOT-based devices such as magnetic random access memory (SOT-MRAM), going beyond the state-of-the-art STT-M RAM.

One preferred NMFI heterostructure is a Ta/$Co_{20}Fe_{60}B_{20}$/$TaO_x$ structure that is formed from a Ta/$Co_{20}Fe_{60}B_{20}$ base with Ta top layer deposited in a wedge shape across the base. The Ta wedge is converted to $TaO_x$ by oxidation. After the oxidation and annealing, non-uniform perpendicular magnetic anisotropy is observed.

The structure magnetization has two stable states that are perpendicular to the plane of the laminate, i.e. pointing up or down. The application of an in-plane current in a metal line that is placed directly below or above the ferromagnetic layer will create a current-induced spin-orbit torque and the direction of the switching is determined by the combination of the direction of current and the direction of symmetry breaking.

Accordingly, a simple, low-cost, base apparatus with the ability to perform SOT-induced switching without the use of external magnetic fields is presented.

An aspect of the technology is to provide a base NM/F/I heterostructure that has a structural mirror asymmetry along the in-plane direction.

According to another aspect of the technology, a method for creating a NM/F/I heterostructure is provided where the in-plane asymmetry is created by varying the thickness of one or more layers, or varying the concentration of a particular atom (such as O) at a particular interface, or within a particular layer, or by introducing an anisotropic in-plane strain into the material during fabrication.

A further aspect of the technology is to provide an apparatus that can determine the direction of switching of the magnetization in perpendicularly magnetized laminates by the combination of the direction of current and the direction of symmetry breaking in the laminate.

Further aspects of the technology described herein will be brought out in the following portions of the specification, wherein the detailed description is for the purpose of fully disclosing preferred embodiments of the technology described herein without placing limitations thereon.

BRIEF DESCRIPTION OF THE SEVERAL VIEWS OF THE DRAWINGS

The technology described herein will be more fully understood by reference to the following drawings which are for illustrative purposes only.

DETAILED DESCRIPTION

Referring more specifically to the drawings, for illustrative purposes, embodiments of the apparatus and methods for producing laminate structures with perpendicular magnetization that can be switched by current induced spin-orbit torques in the absence of external magnetic fields are shown. This is achieved by introducing a lateral structural asymmetry into the laminate structure during fabrication so that the mirror symmetry is broken along both the z- and y-axes of the laminate of the device. The principles of the technology and the laminates can be adapted to many different "spintronic" uses including GMR valves, magnetic random access memory (SOT-MRAM), magnetic tunnel junctions (MTJ), spin transistors, spin diodes and the like.

Laminates with asymmetric structures with SOT induced by in-plane currents are described herein and described and depicted generally in FIG. 1 through FIG. 5. It will be appreciated that the methods may vary as to the specific steps and sequence and the apparatus may vary as to structural details without departing from the basic concepts as disclosed herein. The method steps are merely exemplary of the order that these steps may occur. The steps may occur in any order that is desired, such that it still performs the goals of the claimed technology.

Figure 1:
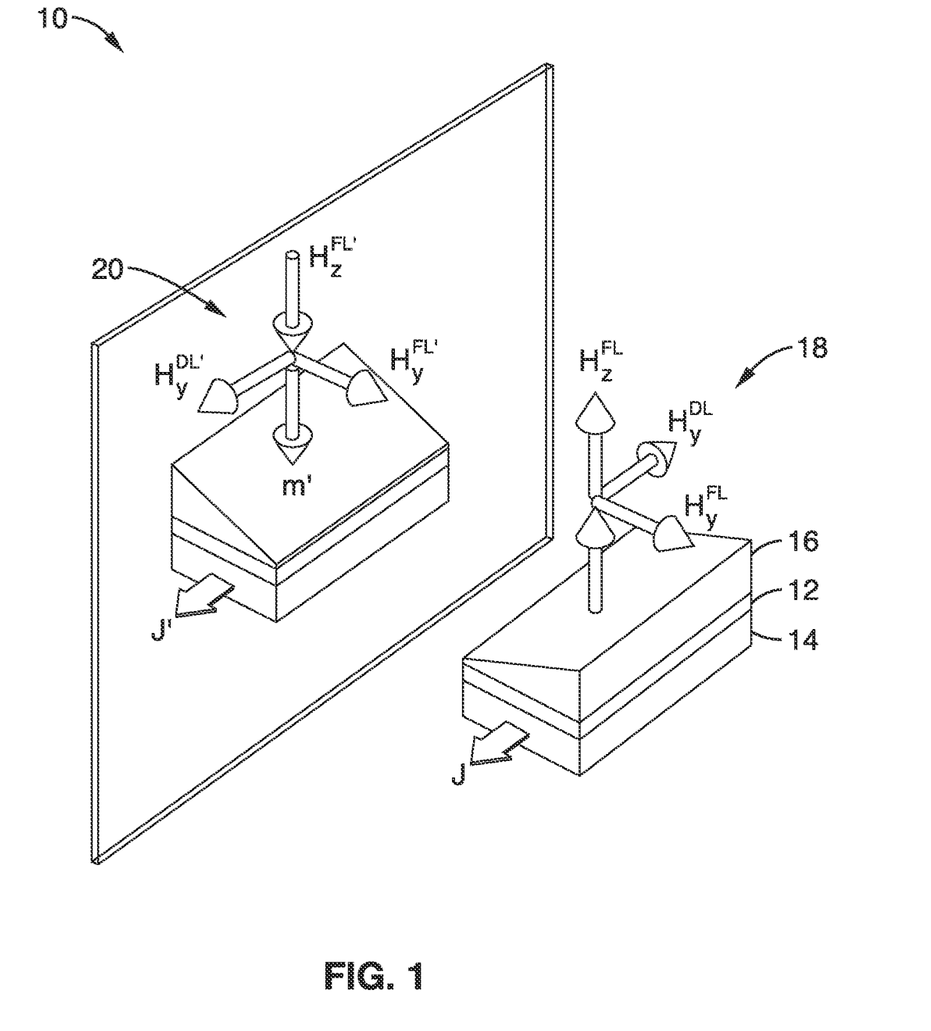
FIG. 1 is a schematic top perspective view of one embodiment of a laminate having a structural asymmetry along the in-plane direction and showing current-induced effective fields corresponding to SOTs including a new perpendicular effective field ($H_z^{FL}$) induced by the laterally asymmetric structure, and its mirror image ($H_z^{FL}$). Mirror symmetry-breaking along both z- and y-axes is also shown.

Turning now to FIG. 1, a three layered laminate is used to illustrate the technology. Although a three layered laminate 10 is described, it will be understood that more complex laminates with additional layers, elements and designs can be fabricated that can incorporate structural and functional aspects of the technology.

The laminate of FIG. 1 and its mirror image are shown along with the current-induced effective fields corresponding to the spin-orbit torques. Exemplary heterostructures exhibiting SOTs in this embodiment may comprise a ferromagnetic (F) layer 12 with a heavy non-magnetic metal (NM) layer 14 having strong spin-orbit coupling on one side, and an insulator (I) layer 16 on the other side. This is referred to as an NM/F/I structure, shown schematically in FIG. 1, which will break mirror symmetry in the growth direction. The SOTs in NM/F/I structures allows for a significantly lower write current compared to regular STT devices. It can greatly improve energy efficiency and scalability for new SOT-based devices such as magnetic random access memory (SOT-MRAM) devices that do not have the deficiencies of STT-MRAM devices.

The device may comprise a variety of materials, in addition to metal contacts (not shown). Preferred materials for the ferromagnetic (F) layer 12 include Fe, CoFe, CoFeB, TbFeCo, and GdFeCo. The ferromagnetic layer 12 may also be formed from a multilayer containing two or more layers of elements of Pd, Pt, Co, Fe, Ta, Hf, CoFe, Ru and CoFeB.

The heavy non-magnetic conductive (NM) layer 14 is preferably formed from Ta, Hf, Gd, W, Mo, Bi, Se, Te, Sb, Pt, Pd, or alloys of high-spin-orbit-coupling materials such as BiSe, BiTe, BiSbSe, and BiSbTe.

The preferred insulator 16 layer is a dielectric (DE) tunnel barrier material such as MgO or $TaO_x$. Although these are provided as examples, many other materials and combinations of materials may be used to implement the technology.

In another embodiment, the laminate may comprise a structure with a ferromagnetic (FM) free layer (e.g., Fe, CoFe, CoFeB, TbFeCo, GdFeCo); a ferromagnetic (FM) fixed layer (e.g., Fe, CoFe, CoFeB, TbFeCo, GdFeCo, or multilayers containing two or more of the elements Pd, Pt, Co, Fe, CoFe, Ru and/or CoFeB); a dielectric (DE) tunnel barrier (e.g., MgO or $TaO_x$); and a high-spin-orbit-coupling material used to generate the current-induced SOT, including Ta, Hf, Gd, W, Pt, Pd, or alloys of high-spin-orbit-coupling materials such as BiSe, BiTe, BiSbSe and BiSbTe.

The fixed layer can be exchange biased by an antiferromagnetic film (e.g., PtMn or IrMn). The fixed layer can also be exchanged biased by a multilayer comprising Pt and Co or Pd and Co. It may also be replaced by a synthetic antiferromagnet (SAF) such as a CoFeRuCoFeB tri-layer where the Ru thickness is chosen such as to provide anti-ferromagnetic interlayer exchange coupling.

The ferromagnetic layer 12 may also be capped (or seeded, depending on the deposition order of the films), or doped, by a metal layer that helps promote a particular anisotropy (such as a perpendicular magnetic anisotropy), or to provide larger voltage-control of anisotropy or larger spin-orbit torque. Examples of materials that can be used as capping, seeding, or doping layers are Ta, Hf, Pt, Pd, Gd, and Ru.

FIG. 1 also illustrates schematically how lateral symmetry-breaking in the device can give rise to current-induced switching of the perpendicular magnetization. The current-induced SOT terms, which are physically allowed for a particular device structure, can be determined based on its symmetry properties.

The effective fields 18 induced by current J, in a perpendicular magnetic structure with the mirror symmetry-broken along both z- and y-axes and the mirror reflections 20 are also illustrated in FIG. 1. The coordinate system of FIG. 1 is chosen such that the z-axis is fixed along the growth direction, and the current is applied along the x-axis.

The new perpendicular effective field ($H_z^{FL}$) of the laterally asymmetric structure, and its mirror image ($H_z^{FL'}$), that are induced by the lateral symmetry-breaking uniquely determines the z-component of the magnetization for a particular direction of current, thereby allowing deterministic switching without external magnetic fields.

Initially, the mirror symmetry-breaking along the z-axis, while preserving mirror symmetries along the x- and y-axes, permits the in-plane effective fields ($H_y^{FL}$ and $H_y^{DL}$) due to the structural inversion asymmetry along the z-axis. The arrows indicate the $H_y^{FL}$ and $H_y^{DL}$ and their mirror reflections $H_y^{FL'}$ and $H_y^{DL'}$ with respect to the xz plane. In this case, the symmetry breaking results in current-induced SOTs, which, to quadratic order in m, consist of a field-like (FL) term $T_c^{FL}=\gamma H_y^{FL} m \times y$ and a damping-like (DL) term $T_c^{DL}=\gamma H_y^{DL} m \times m \times y$. Here, m denotes a unit vector along the magnetization direction. Equivalently, these torques can be expressed in terms of effective magnetic fields, namely $H_y^{FL}=H_y^{FL} y$ and $H_y^{DL}=H_y^{DL} m \times y$, with $H_y^{FL}$ and $H_y^{DL}$ representing the current-dependent proportionality constants for each term.

However, magnetization (being a pseudo-vector) reverses the direction of its components that are parallel to the xz plane, hence resulting in an equilibrium state with $M_z<0$ in the mirror state. As a result, if a particular direction of current allows an equilibrium magnetization state with a positive z component, i.e., $M_z>0$, the same direction of current should also favor a state with $M_z<0$. Consequently, a given current direction does not favor a unique perpendicular magnetization orientation, and hence no deterministic switching is obtained.

Therefore, in order to achieve current-induced switching of perpendicular magnetization, the mirror symmetry with respect to the xz plane also has to be broken. This can be achieved by using an external magnetic field $H_{ap}$ along the current direction. The mirror transformation in this case also reverses the external magnetic field direction. Thus, by fixing the direction of the external field along the current direction, the symmetry between magnetic states with opposite z-components of magnetization is broken, allowing for a unique magnetic state. A positive or negative external field favors the state with a positive/negative $M_z$.

It is also important to note the difference between an external field $H_{ap}$ and the damping-like field $H_y^{DL}$. The damping-like field $H_y^{DL}$ does not break the mirror symmetry about the xz plane as it depends on m and changes signs when the magnetization is reversed, while the external field $H_{ap}$ does break the symmetry.

To eliminate the need for the application of an external magnetic field $H_{ap}$, the mirror symmetry is broken along y-axis by a structural asymmetry in the laminate. When the mirror symmetry along the y-axis is also broken, a particular direction of current can uniquely determine the z-component of magnetization.

As illustrated in FIG. 1, the mirror symmetry along the y-axis is broken with the structural asymmetry along the y-axis of a varying thickness (i.e., a wedge shape) of the insulating layer 16 of the laminate along this axis. The mirror transformation in this case reverses both the direction of $M_z$ and the direction of J (with respect to the wedge), thereby associating each current direction with a unique orientation of $M_z$. In this sense, breaking structural inversion symmetry along the lateral direction can replace the role of the external bias field. This fact is also reflected in the form of the allowed current-induced SOT terms. The current-induced SOT terms (up to quadratic order in m) arising due to mirror asymmetry along both y- and z-axes can be written as follows:

$$T_{SOT}=\gamma H_y^{FL} m \times y + \gamma H_y^{DL} m \times m \times y + \gamma H_z^{FL} m \times z + \gamma H_z^{DL} m \times m \times z.$$

Here, in the last two terms $H_z^{FL}$ and $H_z^{DL}$ parameterize the strengths of the current-induced effective fields arising from the additional inversion asymmetry, respectively representing the new FL and DL SOT terms. The new FL term gives rise to a current-induced effective field ($H_z^{FL}$) along the z-axis as shown in FIG. 1 and can thus facilitate current-induced deterministic switching of perpendicular magnetization in the absence of an external magnetic field.

Figure 2:
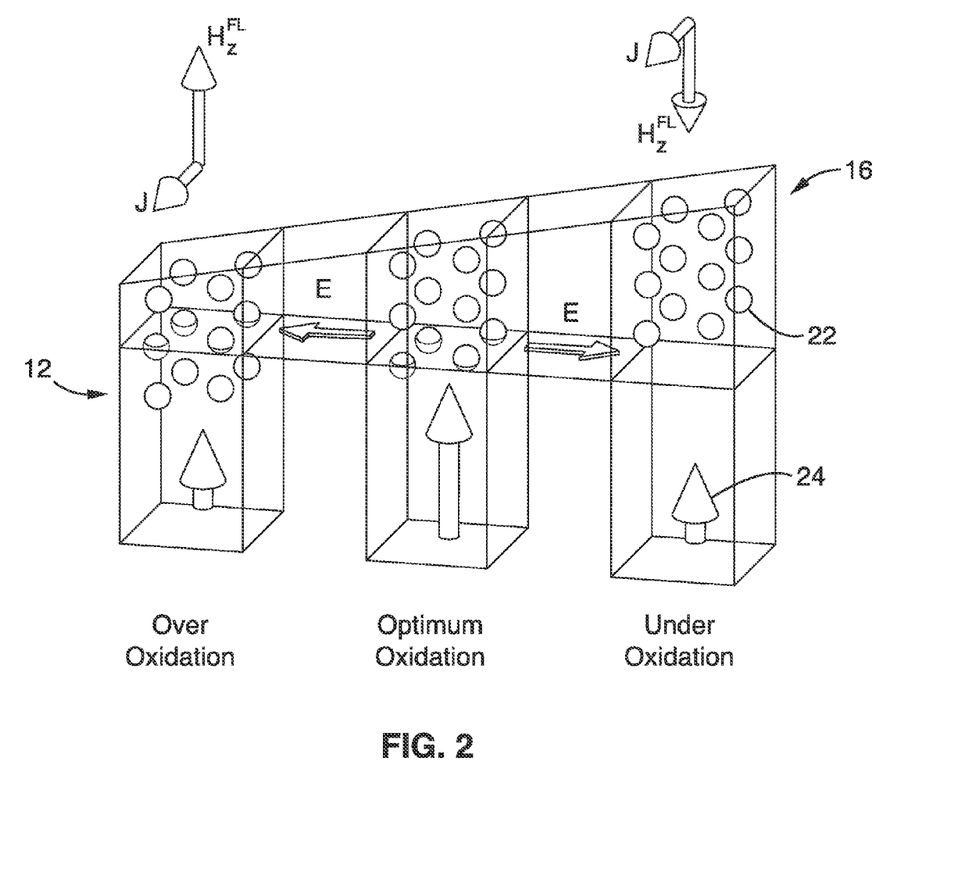
FIG. 2 is a schematic side perspective view of a ferromagnet-oxide interface of a wedge structure, illustrating its non-uniform oxygen content. The resulting non-uniform charge distribution may produce in-plane electric fields (E) along the interface, which in turn can contribute to the observed $H_z^{FL}$.

A schematic representation of the ferromagnet-oxide layer interface, illustrating its non-uniform oxygen content is shown in FIG. 2. The resulting non-uniform charge distribution may produce in-plane electric fields (E) along the interface, which in turn can contribute to the observed $H_z^{FL}$. The spheres 22 indicate the oxygen atoms and the perpendicular arrows 24 correspond to the perpendicular magnetic anisotropy in the magnetic layer 12. As shown in FIG. 2, an electric field along the wedging direction could originate from redistribution of charges near the interface depending on the oxygen content, which is also responsible for the non-monotonic dependence of $H_k$ on position that is observed.

The in-plane asymmetry may be created by a variety of means, including but not limited to varying the thickness of one or more layers during device fabrication, or varying the concentration of a particular atom (such as O) at a particular interface, or within a particular layer, during fabrication, or by introducing an anisotropic in-plane strain into the material during fabrication, for example by interfacing with a strained material (such as a piezoelectric or a ferroelectric). Additional possible means of creating the in-plane asymmetry include the application of an in-plane voltage across the device, or the application of a voltage across the DE layer only on part of the device (such as by patterning a top electrode only partially covering the memory bit).

Figure 3A:
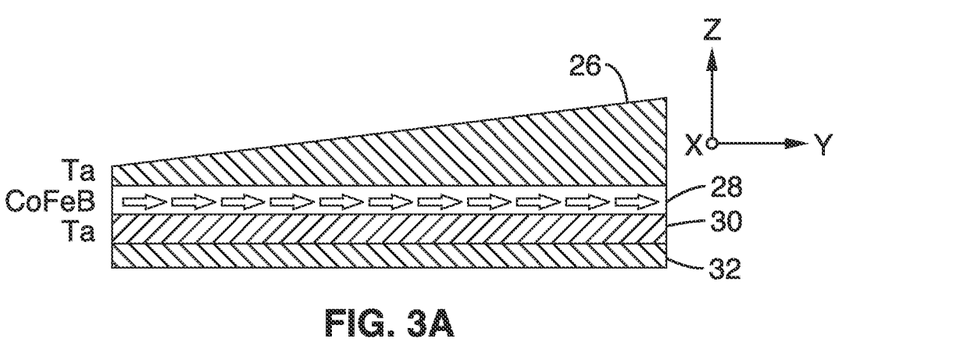
FIG. 3A through FIG. 3C are schematic side views of the basic processing steps for growth and patterning of one embodiment of a basic laminate with lateral asymmetry and the structure of one device in an array (10 μm scale bar) is shown in FIG. 3D and was the measurement configuration for Example 1.
Figure 3B:
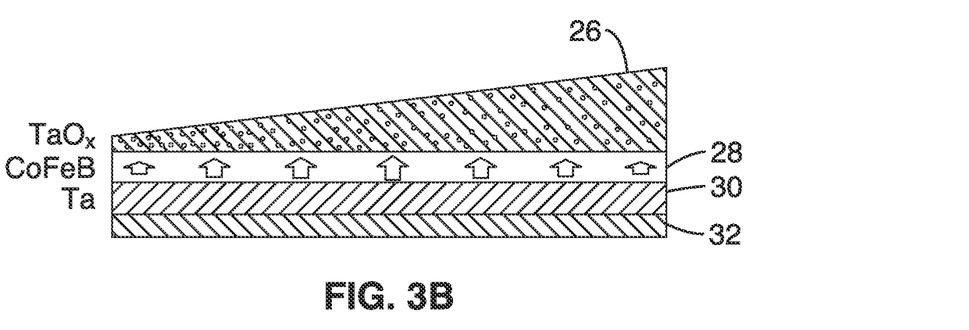
Figure 3C:
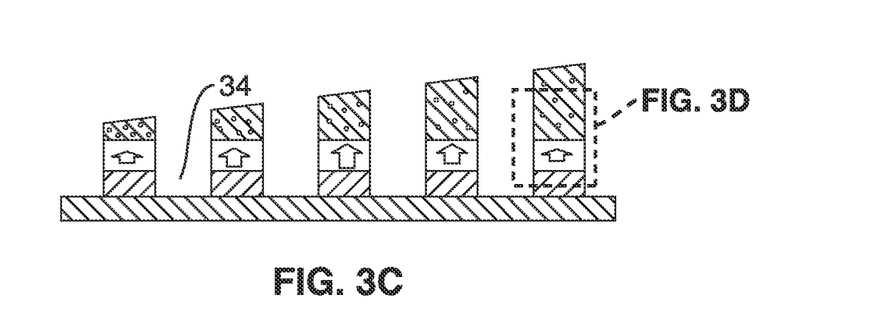

A simple illustration of the procedure for growth and patterning of the devices is set forth in FIG. 3A through FIG. 3C. Initially, as seen in the embodiment of FIG. 3A, a base laminate of a substrate 32, a heavy metal layer 30 and a ferromagnetic layer 28 is provided. Then, a Ta layer 26 is deposited on top of the ferromagnetic (CoFeB) film 28 with a varying thickness across the wafer, resulting in a wedge shape.

The Ta wedge layer 26 is then transformed to $TaO_x$ by oxidation to create a $Co_{20}Fe_{60}B_{20}/TaO_x$ interface as shown in FIG. 3B. The thickness of the resulting oxide wedge layer 26 as well as the oxygen content at the $Co_{20}Fe_{60}B_{20}/TaO_x$ interface change continuously across the wafer due to the laterally asymmetric structure of the oxide in this embodiment.

As shown in FIG. 3C, the wedge shaped structure of FIG. 3B can then be patterned 34 into many different useful structures. In the illustration in FIG. 3C, the structure is patterned into an array of Hall bars. The transverse direction of the Hall bars (i.e., the y-axis) is along the $TaO_x$ wedge, thus breaking the mirror symmetry with respect to the xz plane.

Figure 3D:
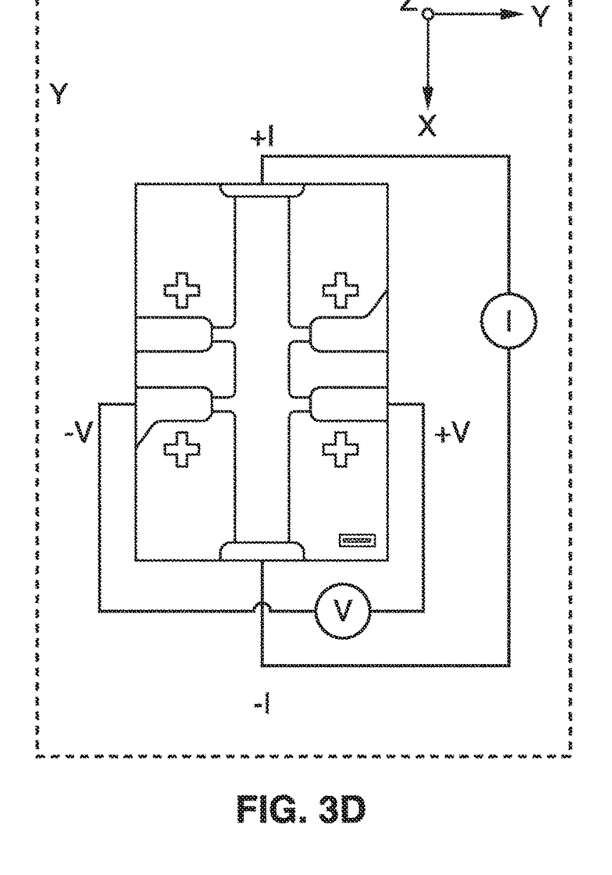

A possible structure of one device in the array (10 μm scale bar) and the measurement configuration for the testing described in the examples below is also shown in FIG. 3D. Each individual device can be designed to have a lateral asymmetry due to the wedge in the $TaO_x$.

In addition, the variation of the effective perpendicular anisotropy field ($H_k$) with respect to position ($dH_k/dy$) can be positive or negative, depending on the device location/thickness along the wedge 26. Due to the non-uniform oxidation at the interface, which depends on the thickness of the initially deposited Ta, a non-monotonic distribution of $H_k$ is obtained.

Figure 4:
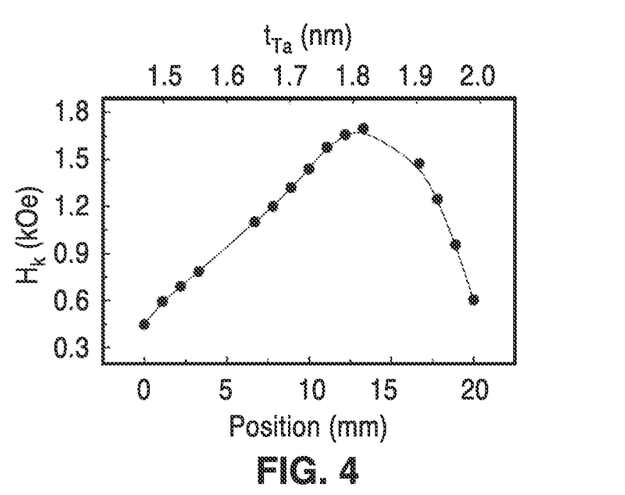
FIG. 4 is a graph of the effective perpendicular anisotropy field ($H_k$) as a function of position/thickness of the devices at room temperature. The variation of $H_k$ with respect to position ($dH_k/dy$) can be positive or negative, depending on the device location along the wedge.

FIG. 4 shows the measured $H_k$ as a function of position along the TaO, gradient direction. The curve shows a non-monotonic dependence of the perpendicular magnetic anisotropy (PMA) on position, indicating an increase of $H_k$ on the thinner side ($dH_k/dy>0$) and decrease of $H_k$ on the thicker side ($dH_k/dy<0$) of the wedge.

Perpendicular magnetization of the $Ta/CoFeB/TaO_k$ was also measured by extraordinary Hall effect (EHE) at different locations along the wedge. A good correlation was found between the out-of-plane coercivity and $H_k$, obtaining a maximum coercivity near the peak of the $H_k$ distribution.

Accordingly, the present technology provides a building block that can be incorporated and adapted to many applications based on switching of the perpendicular magnetization using spin-orbit-torques without the need for any magnetic bias field. The absence of a bias field significantly reduces the design complexity and makes the device more practical for use in most applications.

For example, the structure can be used as the core of a spin-orbit-torque-controlled (SOT-MRAM), which may additionally incorporate magnetoelectric (ME) effects that provide for voltage control of magnetic properties such as in MERAM memory. Readout may be best performed via the tunnel magnetoresistance (TMR) effect.

The SOT devices can also be arranged into an array for memory applications, using transistors or diodes as access devices, such as in a crossbar array with diodes, to provide high integration density. Additionally, layers of SOT-MRAM may be stacked on top of each other to increase the effective density.

In one embodiment, the information could be stored in the state of a magnetic bit (i.e. in a ferromagnetic free layer, FL), where the FL magnetization has two stable states that are perpendicular to the sample plane, i.e. pointing up or down. The FL magnetization can be switched between the two perpendicular states by the application of a horizontal (in-plane) current in a metal line that is placed directly below or above the free layer, creating a current-induced SOT. The device additionally would incorporate a structural asymmetry along the in-plane direction, breaking the in-plane mirror symmetry and the direction of switching is determined by the combination of the direction of current and the direction of symmetry breaking.

Additionally, the base device may optionally incorporate one, several, or all of the following features:

1. The switching may be assisted by application of a voltage to the ferromagnetic free layer (FL), or across a dielectric oxide layer placed adjacent to it, in addition to the current-induced SOT, through a mechanism such as voltage-controlled magnetic anisotropy (VCMA).

2. The base device can have at least one additional dielectric layer DE in close proximity with the FL, and an additional pinned magnetic layer PL separated from the FL by the DE layer, such that the PLDEFL combination allows for readout of the FL magnetization state via the tunnel magnetoresistance (TMR) effect;

3. The application of a voltage across the DE layer may be used to assist the switching (reduce the FL coercivity) during writing, or to stabilize the bit during reading (increase the FL coercivity), using the VCMA effect;

4. The FL or the PLDEFL structure is patterned into a memory bit with typical dimensions smaller than 300 nm, and with a possible shape including but not limited to that of a circle, ellipse, or square; and 5. The relative orientation of the FL states with respect to the PL state results in two stable high and low resistance states HR and LR via the TMR effect.

Figure 5:
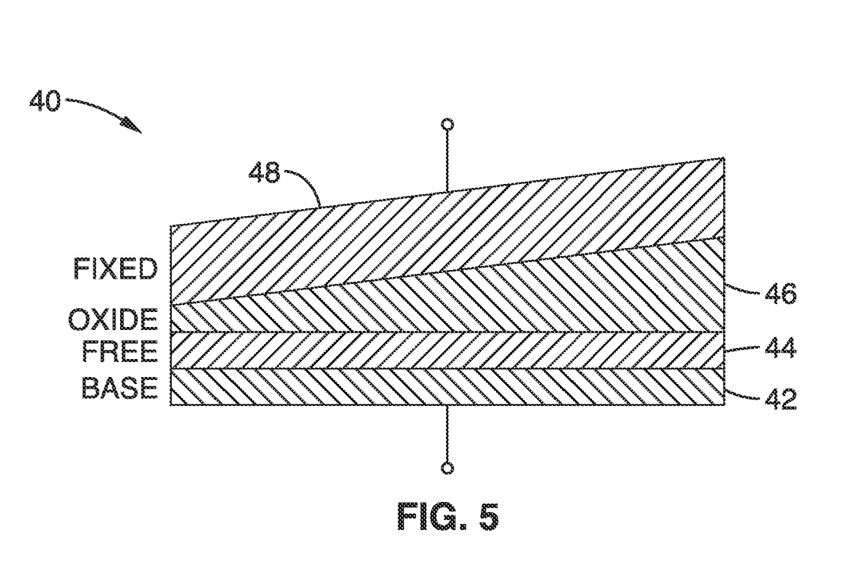
FIG. 5 is a schematic side view of an alternative embodiment of a magnetic structure according to the technology.

Another illustration of the technology is shown schematically in FIG. 5, in the context of a memory structure where information is stored in the state of a magnetic bit (i.e. in a free ferromagnetic layer). The magnetic structure 40 in the embodiment shown in FIG. 5 has a base bottom terminal 42 of a non-magnetic conductive layer.

The base non-magnetic conductive layer 42 is preferably made from a high-spin-orbit-coupling material such as one or more layers of metals and semi-conductors selected from the group consisting of Ta, Hf, Gd, W, Mo, Bi, Se, Te, Sb, Pt and Pd and their alloys or alloys such as BiSe, BiTe, BiSbSe and BiSbTe.

At least one ferromagnetic free layer 44 having magnetization with two stable states perpendicular to the plane of the layer plane is coupled to the base non-magnetic conductive layer 42. The ferromagnetic free layer 44 preferably comprises at least one layer of the group: CoFe, CoFeB, TbFeCo or GdFeCo or a multilayer containing two or more of the elements Pd, Pt, Co, Fe, Ta, Hf or Ru.

A dielectric layer or other insulator layer 46 with lateral structural asymmetry is disposed over the ferromagnetic free layer 44. The device incorporates a structural asymmetry along the in-plane direction, breaking the in-plane mirror symmetry. The dielectric layer 46 preferably comprises at least one layer of MgO or $TaO_x$ that can act as a tunnel barrier.

A pinned or fixed ferromagnetic layer 48 is joined to the top of the dielectric/oxide layer 46. The free layer 44 or the fixed/dielectric/free structure can also be patterned into a memory bit with typical dimensions smaller than 300 nm, and shaped into many possible shapes including a circle, ellipse, or a square.

The ferromagnetic fixed layer 48 is preferably made from a material such as Fe, CoFe, CoFeB, TbFeCo, GdFeCo, or multilayers containing two or more of the elements Pd, Pt, Co, Fe, CoFe, Ru and/or CoFeB.

In another embodiment, the fixed ferromagnetic layer 48 is made from a synthetic antiferromagnetic film of a CoFeRu-CoFeB tri-layer, where the thickness of the Ru layer is chosen to provide anti-ferromagnetic interlayer exchange coupling. One embodiment has a fixed layer 48 that is exchange biased by an antiferromagnetic film of PtMn or IrMn. The fixed layer 48 may also be seeded or doped with a material selected from the group of materials consisting of Ta, Hf, Pt, Pd, Gd and Ru or there may be a separate layer of one or more of these metals.

The application of a voltage across the dielectric layer 46 may be used to assist the switching (reduce the free layer 44 coercivity) during writing, or to stabilize the bit during reading (increase the free layer 44 coercivity), using the VCMA effect.

The relative orientation of the free layer 44 states with respect to the fixed layer 48 state results in two stable high and low resistance states via the TMR effect. The fixed layer/dielectric layer/free layer combination also allows for readout of the free layer (FL) magnetization state via the (TMR) effect.

The free layer 44 magnetization of the device has two stable states that are perpendicular to the sample plane, i.e. pointing up or down. The magnetization can be switched between the two perpendicular states by the application of a horizontal (in-plane) current in the base layer 42 or in a metal line that is placed directly below or above the insulation/oxide layer 46 and free layer 44, creating a current-induced spin-orbit torque. The direction of switching from one side to the other is determined by the combination of the direction of current and the direction of symmetry breaking.

Accordingly, the technology provides a basic structure to perform switching of perpendicular magnetization using SOT, without the need for an external magnetic bias field. The absence of a bias field significantly reduces the design complexity of adaptations of the base magnetic structure.

The technology described herein may be better understood with reference to the accompanying examples, which are intended for purposes of illustration only and should not be construed as in any sense limiting the scope of the technology described herein as defined in the claims appended hereto.

EXAMPLE 1

In order to demonstrate the operational principles of the apparatus and methods, several devices were fabricated and tested. A stack structure of $Ta/CoFeB/TaO_x$ was fabricated from $Ta(5.0$ nm$)/Co_{20}Fe_{60}B_{20}(1.0$ nm$)/Ta$(wedge) sputter-deposited films. The metal layers were deposited on a thermally oxidized wafer (on an area of 10 mm×50 mm) by D.C. magnetron sputtering at room temperature, in an AJA international physical vapor deposition system. The deposition rates were 0.06 nm/s for Ta and 0.03 nm/s for $Co_{20}Fe_{60}B_{20}$ at an argon pressure of 2 mTorr and 3 mTorr, respectively.

The top oxide layer was formed by first depositing a Ta film as a continuous gradient of thickness along the length of the sample to produce a wedge shape across the wafer. The thickness of the top Ta layer was varied from 0.81 nm to 2.13 nm.

The $TaO_x$ layer was then formed by exposing the sample to radio-frequency $O_2$/Ar plasma for 100 s to create a $Co_{20}Fe_{60}B_{20}/TaO_x$ interface. Due to the variation of the top Ta layer thickness, the thickness of the resulting oxide as well as the oxygen content at the $Co_{20}Fe_{60}B_{20}/TaO_x$ interface changed continuously across the wafer. The films were then annealed at 200° C. for 30 min to enhance their perpendicular magnetic anisotropy (PMA).

The films were subsequently patterned into an array of Hall bar devices (seven in the width direction, with constant thickness of the top Ta layer, and thirty-five in the length direction of the sample, varying its thickness) by standard photolithography and dry etching techniques. The size of the Hall bars was fixed at 20 µm×130 µm. The Hall bar lengths were oriented along the width direction of the film, resulting in a varying top Ta thickness (hence oxidation) along the width of the Hall bars (i.e. y-axis). The spacing between two adjacent Hall bar devices in the length direction was 1.1 mm. The transverse direction of the Hall bars (i.e., the y-axis) was along the $TaO_x$ wedge, thereby breaking the mirror symmetry with respect to the xz plane. Thus, application of a current along the Hall bars was expected to produce an out-of-plane effective magnetic field, based on symmetry.

The devices were characterized using extraordinary Hall effect (EHE) measurements. A Keithley 6221 current source and a Keithley 2182A nano-voltmeter were used in the extraordinary Hall voltage measurement. The external magnetic field was generated by a Helmholtz coil driven by a Kepco power supply. All measurements were carried out at room temperature.

The effective perpendicular anisotropy field ($H_k$) of the $Co_{20}Fe_{60}B_{20}$ layer (in the absence of current-induced SOT) was determined using EHE measurements as a function of the applied in-plane magnetic field. The measured effective perpendicular anisotropy field ($H_k$) of the devices was plotted as a function of position/thickness along the direction of the $TaO_x$ gradient. The curves showed a non-monotonic dependence of the perpendicular magnetic anisotropy (PMA) on position, indicating an increase of $H_k$ on the thinner side ($dH_k/dy>0$) and decrease of $H_k$ on the thicker side ($dH_k/dy<0$) of the wedge. The non-monotonic distribution of $H_k$ was obtained due to the non-uniform oxidation at the interface that is dependent on the thickness of the initially deposited Ta. Accordingly, the variation of $H_k$ with respect to position ($dH_k/dy$) can be positive or negative, depending on the device location along the wedge.

The perpendicular magnetization was measured as a function of perpendicular magnetic field and plotted. Perpendicular magnetization of Ta/CoFeB/TaO$_x$ measured by extraordinary Hall effect (EHE) at different locations along the wedge demonstrated a good correlation between the out-of-plane coercivity and H$_k$, obtaining a maximum coercivity near the peak of the H$_k$ distribution. For devices located on the central region of the wedge with the largest H$_k$, the EHE perpendicular loops are square-shaped and showed a large coercivity. As expected, the loops become less square-shaped and eventually turn into hard-axis-like loops on both sides of the wedge where H$_k$ is smaller. The observed PMA is due to the interfacial magnetic anisotropy between the Co$_{20}$Fe$_{60}$B$_{20}$ film and its adjacent TaO$_x$ and Ta layers. The anisotropy associated with the TaO$_x$ interface is in turn affected by the appearance of Fe—O and Co—O bonds at the interface, exhibiting a non-monotonic dependence on the oxygen content. As a result, the change of PMA across the wedge reflects the gradient of oxygen concentration at the Co$_{20}$Fe$_{60}$B$_{20}$/TaO$_x$ interface across the wafer.

EXAMPLE 2

To further demonstrate the functionality of the devices, EHE measurements were performed on the Hall bar devices for a set of different direct currents applied along the x-axis. The perpendicular magnetization of Ta/CoFeB/TaO$_x$ was measured by EHE, while a current of ±1 mA, ±6 mA, and ±10 mA was applied to the devices.

EHE signals were measured for the first device (device A, t$_{Ta}$=1.65 nm prior to oxidation) in the dH$_k$/dy>0 region. As expected, small currents had almost no influence on the switching behavior. At larger currents, however, the centers of the hysteresis loops were gradually shifted in the negative direction for currents of a positive polarity, which indicates the presence of a perpendicular effective field, H$_z^{FL}$=H$_z^{FL}$z induced by the current. The value of H$_z^{FL}$ can be extracted from the average of the positive (H$_S^+$) and negative (H$_S^-$) switching fields, i.e. H$_z^{FL}$=−(H$_S^+$+H$_S^-$)/2. For currents in the opposite direction, the hysteresis loops are shifted in the positive direction. At current values of I=±10 mA, the separation between the two loops for this device was H$_z^{FL}$(10 mA)−H$_z^{FL}$(−10 mA)≈22 Oe.

EHE signals were also measured for second device (device B, t$_{Ta}$=1.94 nm prior to oxidation) in the dH$_k$/dy<0 region (i.e. on the opposite side of the anisotropy peak) and compared with the results of device A. In the case of device B, the sign of the current-induced field was opposite to that of device A for the same direction of current flow. The separation between the two loops for device B was I=±10 mA is H$_z^{FL}$(10 mA)−H$_z^{FL}$(−10 mA)≈−66 Oe. A comparison of the H$_z^{FL}$ values for the two devices, indicated that H$_z^{FL}$(I>0)−H$_z^{FL}$(I<0)>0 [i.e. dH$_z^{FL}$/dl>0] in the dH$_k$/dy>0 region, while H$_z^{FL}$(I>0)−H$_z^{FL}$(I<0)<0 [i.e. dH$_z^{FL}$/dl<0] in the dH$_k$/dy<0 region.

Accordingly, the shift directions of the EHE loops with respect to current, which reflect the directions of H$_z^{FL}$ induced by the current, are opposite for these two devices with opposite signs of dH$_k$/dy.

To quantify the H$_z^{FL}$ induced by current, the values of H$_S^+$ and H$_S^-$ for the two devices (obtained from plotted EHE loops), were evaluated and plotted for different applied currents for device A (dH$_k$/dy>0) and device B (dH$_k$/dy<0).

Measured switching fields as a function of current were plotted for devices A and B with dH$_k$/dy=0.09 Oe/µm and −0.24 Oe/µm, respectively. The values of β, representing the perpendicular effective field (H$_z^{FL}$=βJ), were extracted from the slope. The values of β, measured along the wedge for both devices had the largest absolute value of β reaching ~56 Oe per 10$^{11}$Am$^{-2}$. The current-induced perpendicular field was obtained by fitting the current dependence of H$_z^{FL}$=−(H$_S^+$+H$_S^-$)/2. For both devices, the resultant I-CL could be fitted well to a linear curve, and hence could be expressed as H$_z^{FL}$=βJ, where J is the applied current density.

The dH$_k$/dy as a function of position along the wedge was also plotted for comparison. It could be seen that both the sign and magnitude of β, and hence H$_z^{FL}$, corresponded well with dH$_k$/dy. Thus, in addition to the sign and magnitude of the applied current, the current-induced H$_z^{FL}$ also depends on the sign and magnitude of dH$_k$/dy. This, in turn, established the correlation of the strength of H$_z^{FL}$ with symmetry-breaking along the y-axis of the devices.

EXAMPLE 3

To further demonstrate the functionality of the apparatus, the selective switching of the magnetization in an out-of-plane magnetized film without the assistance of external magnetic fields was illustrated by manipulation of the perpendicular effective field H$_z^{FL}$ induced by an in-plane current along the x-axis of the devices.

The capability of the apparatus to reversibly switch the perpendicular magnetization was illustrated with currents of ~6 mA (corresponding to a current density of 5.0×10$^6$ A/cm$^2$) for device A (t$_{Ta}$=1.67 nm before oxidation), and by current of ~3 mA (corresponding to a current density of 2.5×10$^6$ A/cm$^2$) for device B. The favored magnetization direction for each current direction is opposite for these two devices, due to the opposite orientations of the current-induced H$_z^{FL}$ (i.e. different signs of β). All measurements were carried out at room temperature.

Perpendicular magnetization as a function of direct current for devices A (t$_{Ta}$=1.67 nm before oxidation) and B (t$_{Ta}$=1.94 nm before oxidation) with dH$_k$/dy=0.10 and −0.24 Oe/µm, respectively was plotted. For device A, which is in the dH$_k$/dy>0 region, positive currents favor a positive magnetization (resulting in a negative Hall resistance R$_{Hall}$).

For device B, which is in the dH$_k$/dy<0 region, positive currents favor a negative magnetization. The favored direction of magnetization for a particular current direction was dependent on the sign of β, and hence depended on the location along the wedge, as predicted. Therefore, currents of opposite polarities can be used to switch the perpendicular magnetization in opposite directions, and the favored direction of magnetization for each current is determined by the sign of the lateral device asymmetry, as quantified by the sign of dH$_k$/dy.

Similar results were obtained for several other devices measured at different points along the wedge. Due to the correlation between dH$_k$/dy and the strength of H$_z^{FL}$, the current density required for switching can be further reduced by increasing the value of dH$_k$/dy, i.e. by creating a larger structural asymmetry in the device.

For device applications, the perpendicular H$_z^{FL}$ induced by currents laminates can be used in three-terminal structures, where the perpendicular ferromagnetic free layer is part of a magnetic tunnel junction, allowing for readout of its state via the tunneling magnetoresistance (TMR) effect. No external in-plane magnetic fields would be needed to operate the device.

It should also be noted that the non-uniform oxidation method used to create the lateral asymmetry in the apparatus is not the only approach that could be used for this purpose. For integration into large device arrays (e.g. for memory chips), which requires uniformity across the wafer, a more localized method of generating the lateral asymmetry may be employed. For example, alternative approaches for creating the torques include the application of a lateral voltage to the device, using effects such as voltage-controlled magnetic anisotropy, or to use a non-uniform strain built into the device during the fabrication process, all of which could be used to break the lateral inversion symmetry. By providing a large perpendicular effective field, such structures can result in new ultralow-power and highly scalable SOT-based spintronic memory and logic circuits.

It should also be noted that the memory devices described herein can be integrated into a magnetic random access memory circuit, for example, by integration with access devices such as diodes or transistors. In one embodiment the SOT memory elements can be arranged on a common word line, with transistors as access devices located on the two ends to provide the write current.

Selection of particular devices which will be written into will be accomplished by applying voltages to their respective bit lines, which will in turn reduce their magnetic coercivity in order to allow for current-induced switching via the SOT from the underlying conductive layer. Hence, in this writing scheme, the transistors at the two end of the word line are programmed to provide the appropriate direction of the write current to switch selected bits to the 0 or 1 state, while selection of the bits which will be written into is performed by the voltage on the respective bit lines.

Readout will be performed by turning at least one of the transistors connected to the word line to the ON condition, while applying a smaller (or reverse polarity) voltage to the bit line which is connected to the bit the information of which is to be read out. By reading the resistance of the bit in this manner, via the TMR effect, the information in the bit (state of 1 or 0) can be ascertained.

In another embodiment, diodes can be connected to each of the memory elements in the array. The diodes serve to prevent shunting or sneak paths for current during read and write operations. Each word line or bit like may be connected at one or both ends to a select transistor and/or other circuitry to provide the currents and voltages required for operation.

Writing of information is performed by passing current horizontally through the word lines adjacent to the free layers, while selection of each device to be written into is performed by applying voltages to reduce its magnetic coercivity. Readout is performed by applying a voltage smaller than the write voltage through the bit and word lines connected to a particular bit to be selected, and reading its resistance to ascertain its information (State of 1 or 0) via the TMR effect.

EXAMPLE 4

The mechanisms behind the creation of the new perpendicular effective field were also explored to verify the principles of operation. One possible mechanism, in addition to spin-orbit effects, is the potential contribution of current-induced magnetic (Oersted) fields to the observed perpendicular switching. However, this possibility was ruled out in the devices.

Due to the non-uniform oxidation of the $TaO_x$ layer, the structural asymmetry of the laminate may cause a non-uniform current density along the width of the device. As a consequence, there will be a larger current density on one side (less oxidized part) of the Hall bar, producing a net perpendicular magnetic field within the Hall bar area. However, for a particular current direction, this kind of Oersted field would be expected to point in the same direction for all Hall bars, since they all have an identical direction of the $TaO_x$ thickness gradient. Therefore, based on the asymmetric structure, the Oersted field should result in a negative sign of β for all devices, which was not observed. This indicates that Oersted fields are not the origin of the observed $H_z^{FL}$ in the tested devices.

In addition, the Oersted field induced by current in the device structures was estimated mathematically. The estimations indicate that the value of the Oersted field induced by current is ~16 times smaller than the largest current-induced perpendicular shift (induced by $H_z^{FL}$) observed experimentally. Consequently, the role of Oersted fields can be excluded and the origin of the observed perpendicular loop shifts is attributed to the SOT.

Additionally, the possibility of a multi-domain process playing a role in the observed FL shifts in the hysteresis loops was also ruled out. This was done by measuring $H_z^{FL}$ via independent second-harmonic measurements in the presence of large external magnetic fields. The applied field was larger than the saturation field of the tested devices, ensuring single-domain behavior during the experiment. The results showed an excellent agreement between the current-induced $H_z^{FL}$ extracted from second-harmonic measurements and the hysteresis loop shifts.

The magnitude of the new perpendicular effective field $H_z^{FL}$ was also compared to the regular effective field $H^{FL}$, which results from the of inversion asymmetry along the z-axis. The largest magnitude of $H_z^{FL}$ in the tested devices was 4.7 Oe/mA, ≈56 Oe per $10^{11}$ $Am^{-2}$. The $H_y^{FL}$ as measured by the second-harmonic method, on the other hand, was 170 Oe per $10^{11}$ $Am^{-2}$ for the same device. Thus, the perpendicular effective field $H_z^{FL}$ is of sizable strength when compared to the regular (in-plane) field-like term induced by breaking of inversion symmetry along the z-axis. However, the presence of this additional $H_z^{FL}$ provides significant advantages for device applications, as it enables bias-field-free switching of out-of-plane magnetic layers.

Microscopically, the new field-like torque appears to stem from the lateral oxidation gradient at the $Co_{20}Fe_{60}B_{20}/TaO_x$ interface, which can induce Rashba-like spin-orbit coupling with the effective electric field direction pointing along the wedging direction y. Namely, a microscopic electron Hamiltonian of the form $\mathcal{H} \sim \sigma \cdot (y \times p)^{16}$, at the $Co_{20}Fe_{60}B_{20}/TaO_x$ interface, could in principle account for a field-like torque of the form $T^{FL} \sim m \times H_z^{FL} \sim m \times (y \times (_{y \, x} J)$. Here σ and p stand for the Pauli matrices and the electron's momentum operator, respectively. An electric field along the wedging direction could, in turn, originate from redistribution of charges near the interface depending on the oxygen content, which may also be responsible for the non-monotonic dependence of $H_k$ on position.

From the description herein, it will be appreciated that the present disclosure encompasses multiple embodiments which include, but are not limited to, the following:

1. A magnetic structure with perpendicular anisotropy, comprising:
   (a) a non-magnetic conductive layer; (b) at least one ferromagnetic layer having magnetization with two stable states perpendicular to a layer plane coupled to the non-magnetic layer; and (c) an insulator layer with lateral structural asymmetry over the ferromagnetic layer; (d) wherein the perpendicular magnetization is switched from a first side to a second side with an in plane current in the non-magnetic metal layer without the application of an external magnetic field.

2. The structure as recited in any previous embodiment, wherein the heavy non-magnetic layer comprises one or more layers of a material selected from the group of materials consisting of Ta, Hf, Gd, W, Mo, Bi, Te, Sb, Pt and Pd and their alloys.

3. The structure as recited in any previous embodiment, wherein the heavy non-magnetic layer comprises one or more layers of alloys of high-spin-orbit-coupling materials selected from the group: BiSe, BiTe, BiSbSe and BiSbTe.

4. The structure as recited in any previous embodiment, wherein the ferromagnetic layer comprises at least one layer of material selected of the group of materials consisting of Fe, CoFe, CoFeB, TbFeCo and GdFeCo.

5. The structure as recited in any previous embodiment, wherein the ferromagnetic layer comprises a multilayer containing two or more of the elements Pd, Pt, Co, Fe, Ta, Hf, CoFe, Ru and CoFeB.

6. The structure as recited in any previous embodiment, wherein the insulator layer comprises $TaO_x$ or MgO.

7. The structure as recited in any previous embodiment, further comprising: a dielectric tunnel barrier layer; and a ferromagnetic fixed layer disposed over the dielectric tunnel barrier layer, the dielectric tunnel barrier layer separating the ferromagnetic fixed layer from the ferromagnetic free layer.

8. The structure as recited in any previous embodiment, wherein the ferromagnetic fixed layer comprises at least one layer of material selected of the group of materials consisting of Fe, Pt, Pd, Co, Ta, Hf, Ru, CoFe, CoFeB, TbFeCo and GdFeCo.

9. The structure as recited in any previous embodiment, wherein the ferromagnetic fixed layer is capped with a material selected of the group of materials consisting of Ta, Hf, Pt, Pd, Gd and Ru.

10. The structure as recited in any previous embodiment, wherein the dielectric tunnel barrier layer comprises at least one layer of MgO or $TaO_x$.

11. A magnetic memory structure with perpendicular anisotropy, comprising: (a) a bottom terminal of a non-magnetic conductive layer; (b) at least one free ferromagnetic layer having magnetization with two stable states perpendicular to a layer plane coupled to the non-magnetic conductive layer; (c) an insulator layer with lateral structural asymmetry over the ferromagnetic free layer; and (d) a fixed ferromagnetic layer joined to the insulator layer; and (e) a top terminal coupled to the fixed ferromagnetic layer; (f) wherein the perpendicular magnetization is switched from a first side to a second side with an in-plane current in the non-magnetic metal layer; and (g) wherein the direction of switching is determined by the combination of the direction of an applied current and the direction of symmetry breaking of the lateral structural symmetry of the insulator layer.

12. The structure as recited in any previous embodiment, wherein the non-magnetic conductive layer comprises one or more layers of metals selected from the group of metals consisting of Ta, Hf, Gd, W, Mo, Bi, Te, Sb, Pt and Pd and their alloys.

13. The structure as recited in any previous embodiment, wherein the fixed layer is exchange biased by an antiferromagnetic film selected from the group of PtMn, IrMn, multilayers of Pt and Co, and multilayers of Pd.

14. The structure as recited in any previous embodiment, wherein the fixed layer is a synthetic antiferromagnetic film of a CoFeRuCoFeB tri-layer, where the Ru thickness is chosen such as to provide anti-ferromagnetic interlayer exchange coupling.

15. The structure as recited in any previous embodiment, wherein the fixed layer is seeded or doped or capped with a material selected from the group of materials consisting of Ta, Hf, Pt, Pd, Gd and Ru.

16. The structure as recited in any previous embodiment, wherein the dielectric tunnel barrier layer comprises at least one layer of MgO or $TaO_x$.

17. The structure as recited in any previous embodiment, further comprising an electrode coupled to the fixed layer, wherein application of a voltage across the dielectric layer assists the magnetization switching by reducing free layer coercivity during writing.

18. The structure as recited in any previous embodiment, further comprising an electrode coupled to the fixed layer, wherein application of a voltage across the dielectric layer assists the magnetization switching by stabilizing the bit during reading by increasing free layer coercivity using (VCMA).

19. The structure as recited in any previous embodiment, wherein the ferromagnetic fixed layer comprises at least one layer of material selected of the group of materials consisting of Fe, Pt, Pd, Co, Ta, Hf, Ru, CoFe, CoFeB, TbFeCo and GdFeCo.

20. A method for switching perpendicular magnetization of a magnetic device having a ferromagnetic layer without the application of an external magnetic field, comprising: (a) providing a heterostructure of a ferromagnetic layer with heavy non-magnetic metal layer on one side and an insulator on the other side, having two stable states that are perpendicular to a structure plane; (b) creating a lateral in-plane asymmetry in the insulator layer; (c) applying a current to the non-magnetic metal layer to induce spin orbital torque; and (d) switching a direction of perpendicular magnetization by changing the direction of the applied current.

21. An improved memory device having a free layer (FL) where information is stored in the state of a magnetic bit, the improvement comprising: (a) the FL having magnetization with two stable states that are perpendicular to a sample plane; (b) the FL magnetization being switchable between the two perpendicular states by the application of a horizontal (in-plane) current in a metal line that is placed directly below or above the free layer, whereby a current-induced spin-orbit torque is created; (c) the device having a structural asymmetry along the in-plane direction, breaking the in-plane mirror symmetry; (d) wherein the direction of switching is determined by the combination of the direction of current and the direction of symmetry breaking.

22. The improved memory device as recited in any preceding embodiment, wherein switching is assisted by application of a voltage to the FL, or across a dielectric layer placed adjacent to it, in addition to the current-induced spin-orbit torque, through a mechanism such as voltage-controlled magnetic anisotropy (VCMA).

23. The improved memory device as recited in any preceding embodiment, further comprising at least one additional dielectric layer DE in close proximity with the FL, and an additional pinned magnetic layer PL separated from the FL by the DE layer, such that the PLDEFL combination allows for readout of the FL magnetization state via the tunnel magnetoresistance (TMR) effect.

24. The improved memory device as recited in any preceding embodiment, wherein application of a voltage across the DE layer is used to assist the switching (reduce the FL coercivity) during writing, or to stabilize the bit during reading (increase the FL coercivity), using the VCMA effect.

25. The improved memory device as recited in any preceding embodiment, wherein the FL or the PLDEFL structure is patterned into a memory bit with typical dimensions smaller than 300 nm, and with a possible shape including but not limited to that of a circle, ellipse, or square.

26. The improved memory device recited in any preceding embodiment, wherein the relative orientation of the FL states with respect to the PL state results in two stable high and low resistance states HR and LR via the TMR effect.

27. The improved memory device as recited in any preceding embodiment, wherein the in-plane asymmetry may be created by a variety of means, including but not limited to varying the thickness of one or more layers during device fabrication, or varying the concentration of a particular atom (such as O) at a particular interface, or within a particular layer, during fabrication, or by introducing an anisotropic in-plane strain into the material during fabrication, for example by interfacing with a strained material (such as a piezoelectric or a ferroelectric).

28. The improved memory device as recited in any preceding embodiment, wherein the in-plane asymmetry is created by application of an in-plane voltage across the device, or application of a voltage across the DE layer only on part of the device (such as by patterning a top electrode only partially covering the memory bit).

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

In the claims, reference to an element in the singular is not intended to mean "one and only one" unless explicitly so stated, but rather "one or more." All structural, chemical, and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for." No claim element herein is to be construed as a "step plus function" element unless the element is expressly recited using the phrase "step for."

What is clamed is:

1. A magnetic structure with perpendicular anisotropy, comprising:
   (a) a non-magnetic conductive layer of one or more layers of alloys of high-spin-orbit-coupling materials selected from the group BiSe, BiTe, BiSbSe and BiSbTe;
   (b) at least one ferromagnetic free layer having magnetization with two stable states perpendicular to a layer plane coupled to the non-magnetic layer; and
   (c) an insulator layer with lateral structural asymmetry coupled to the ferromagnetic free layer;
   (d) wherein the perpendicular magnetization is switchable from a first side to a second side with an in plane current in the non-magnetic layer conductive, without the application of an external magnetic field.

2. The structure of claim 1, wherein said ferromagnetic free layer comprises at least one layer of material selected of the group of materials consisting of Fe, CoFe, CoFeB, TbFeCo and GdFeCo.

3. The structure of claim 1, wherein said ferromagnetic free layer comprises a multilayer containing two or more of the elements Pd, Pt, Co, Fe, Ta, Hf, CoFe, Ru and CoFeB.

4. The structure of claim 1, wherein said insulator layer comprises $TaO_x$, or MgO.

5. The structure of claim 1, further comprising:
   a dielectric tunnel barrier layer; and
   a ferromagnetic fixed layer disposed over the dielectric tunnel barrier layer, the dielectric tunnel barrier layer separating the ferromagnetic fixed layer from the ferromagnetic free layer.

6. The structure of claim 5, wherein said ferromagnetic fixed layer comprises at least one layer of material selected of the group of materials consisting of Fe, Pt, Pd, Co, Ta, Hf, Ru, CoFe, CoFeB, TbFeCo and GdFeCo.

7. The structure of claim 5, wherein said ferromagnetic fixed layer further comprises a capped layer with a material selected of the group of materials consisting of Ta, Hf, Pt, Pd, Gd and Ru.

8. The structure of claim 5, wherein said dielectric tunnel barrier layer comprises at least one layer of MgO or $TaO_x$.

9. A magnetic memory structure with perpendicular anisotropy, comprising:
   (a) a bottom terminal of a non-magnetic conductive layer;
   (b) at least one free ferromagnetic layer having magnetization with two stable states perpendicular to a layer plane coupled to the non-magnetic conductive layer;
   (c) an insulator layer with lateral structural asymmetry over the ferromagnetic free layer; and
   (d) a fixed ferromagnetic layer joined to the insulator layer, the fixed layer comprising a synthetic anti-ferromagnetic film of a CoFe/Ru/CoFeB tri-layer, where the Ru thickness is chosen to provide anti-ferromagnetic inter-layer exchange coupling; and
   (e) a top terminal coupled to the fixed ferromagnetic layer;
   (f) wherein the perpendicular magnetization is switchable from a first side to a second side with an in-plane current in the non-magnetic metal layer; and
   (g) wherein the direction of switching is determined by the combination of the direction of an applied current and the direction of symmetry breaking of the lateral structural symmetry of the insulator layer.

10. The structure of claim 9, wherein said non-magnetic conductive layer comprises one or more layers of metals selected from the group of metals consisting of Ta, Hf, Gd, W, Mo, Bi, Te, Sb, Pt and Pd and their alloys.

11. The structure of claim 9, wherein the fixed layer is capped with a material selected from the group of materials consisting of Ta, Hf, Pt, Pd, Gd and Ru.

12. The structure of claim 9, wherein said dielectric tunnel barrier layer comprises at least one layer of MgO or $TaO_x$.

13. The structure of claim 9, further comprising an electrode coupled to the fixed layer, wherein application of a voltage across the dielectric layer assists the magnetization switching by reducing free layer coercivity during writing.

14. The structure of claim 9, further comprising an electrode coupled to the fixed layer, wherein application of a voltage across the dielectric layer assists the magnetization reading by stabilizing the bit during reading by increasing free layer coercivity using (VCMA).

15. The structure of claim 9, wherein said ferromagnetic fixed layer comprises at least one layer of material selected of the group of materials consisting of Fe, Pt, Pd, Co, Ta, Hf, Ru, CoFe, CoFeB, TbFeCo and GdFeCo.

16. A method for switching perpendicular magnetization of a magnetic device having a ferromagnetic layer without the application of an external magnetic field, comprising:
   (a) providing a heterostructure of a ferromagnetic layer with heavy non-magnetic metal layer selected from the group BiSi, BiTe, BiSbSe, and BiSbTe on one side and an insulator on the other side, having two stable states that are perpendicular to a structure plane;

(b) creating a lateral in-plane asymmetry in the insulator layer;
(c) applying a current to the non-magnetic metal layer to induce spin orbital torque; and
(d) switching a direction of perpendicular magnetization by changing the direction of the applied current.

17. A magnetic structure with perpendicular anisotropy, comprising:
(a) a non-magnetic conductive layer;
(b) at least one ferromagnetic free layer having magnetization with two stable states perpendicular to a layer plane coupled to the non-magnetic layer; and
(c) an insulator layer coupled to the ferromagnetic layer;
(d) wherein at least one of the layers chosen among the group of the non-magnetic layer, the ferromagnetic free layer, and the insulator layer, has an asymmetric structure along an in-plane direction of the device, and
(e) wherein the perpendicular magnetization is switchable from a first side to a second side with an in plane current in the non-magnetic layer without the application of an external magnetic field; and
(f) wherein said in-plane structural asymmetry is created by varying the concentration of a particular element at an interface between layers along an in-plane direction of the device.

18. The structure of claim 17, wherein said in-plane structural asymmetry is created by varying the thickness of at least one of the layers along an in-plane direction of the device.

19. The structure of claim 17, wherein said element at an interface between layers comprises Oxygen(O).

20. The structure of claim 17, wherein said non-magnetic layer comprises one or more layers of metals selected from the group of metals consisting of Ta, Hf, Gd, W, Mo, Bi, Te, Sb, Pt and Pd and their alloys.

21. The structure of claim 17, wherein said non-magnetic layer comprises one or more layers of alloys of high-spin-orbit-coupling materials selected from the group BiSe, BiTe, BiSbSe and BiSbTe.

22. The structure of claim 17, wherein said ferromagnetic free layer comprises at least one layer of material selected of the group of materials consisting of Fe, CoFe, CoFeB, TbFeCo and GdFeCo.

23. The structure of claim 17, wherein said ferromagnetic free layer comprises a multilayer containing two or more of the elements Pd, Pt, Co, Fe, Ta, Hf, CoFe, Ru and CoFeB.

24. The structure of claim 17, wherein said insulator layer comprises $TaO_x$ or MgO.

25. The structure of claim 17, further comprising:
a dielectric tunnel barrier layer; and
a ferromagnetic fixed layer disposed over the dielectric tunnel barrier layer, the dielectric tunnel barrier layer separating the ferromagnetic fixed layer from the ferromagnetic free layer.

26. A magnetic structure with perpendicular anisotropy, comprising:
(a) a non-magnetic conductive layer of one or more layers of alloys of high-spin-orbit-coupling materials selected from the group BiSe, BiTe, BiSbSe and BiSbTe;
(b) at least one ferromagnetic free layer having magnetization with two stable states perpendicular to a layer plane coupled to the non-magnetic layer; and
(c) an insulator layer coupled to the ferromagnetic layer;
(d) wherein at least one of the layers chosen among the group of the non-magnetic layer, the ferromagnetic free layer, and the insulator layer, has an asymmetric structure along an in-plane direction of the device, and
(e) wherein the perpendicular magnetization is switchable from a first side to a second side with an in plane current in the non-magnetic conductive, layer without the application of an external magnetic field.

27. The structure of claim 26, wherein said ferromagnetic free layer comprises at least one layer of material selected of the group of materials consisting of Fe, CoFe, CoFeB, TbFeCo and GdFeCo.

28. The structure of claim 26, wherein said ferromagnetic free layer comprises a multilayer containing two or more of the elements Pd, Pt, Co, Fe, Ta, Hf, CoFe, Ru and CoFeB.

29. The structure of claim 26, wherein said insulator layer comprises $TaO_x$ or MgO.

30. The structure of claim 26, further comprising:
a dielectric tunnel barrier layer; and
a ferromagnetic fixed layer disposed over the dielectric tunnel barrier layer, the dielectric tunnel barrier layer separating the ferromagnetic fixed layer from the ferromagnetic free layer.

* * * * *